(12) United States Patent
Chang et al.

(10) Patent No.: US 7,791,428 B2
(45) Date of Patent: Sep. 7, 2010

(54) ALL-DIGITAL PHASE-LOCKED LOOP, LOOP BANDWIDTH CALIBRATION METHOD, AND LOOP GAIN CALIBRATION METHOD FOR THE SAME

(75) Inventors: Hsiang-Hui Chang, Taipei Hsien (TW); Ping-Ying Wang, Hsinchu (TW); Jing-Hong Conan Zhan, HsinChu (TW); Bing-Yu Hsieh, Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/235,615

(22) Filed: Sep. 23, 2008

(65) Prior Publication Data

US 2009/0096538 A1  Apr. 16, 2009

Related U.S. Application Data

(60) Provisional application No. 60/980,172, filed on Oct. 16, 2007, provisional application No. 60/980,461, filed on Oct. 17, 2007.

(51) Int. Cl.
*H03C 3/02* (2006.01)
*H03C 3/08* (2006.01)
(52) U.S. Cl. .................. 332/123; 332/127; 332/128; 331/1 A; 331/16
(58) Field of Classification Search ............... 332/127, 332/128, 117, 118, 123, 124; 331/17, 16, 331/1 A; 327/156, 159; 375/376
See application file for complete search history.

(56) References Cited

U.S. PATENT DOCUMENTS

| 5,983,077 | A  | * | 11/1999 | Dent .......................... 455/44 |
| 7,495,516 | B2 |   | 2/2009  | Travis |
| 7,573,348 | B2 | * | 8/2009  | Bauernfeind et al. ........ 332/126 |
| 2003/0234693 | A1 | * | 12/2003 | Staszewski et al. .......... 331/16 |

OTHER PUBLICATIONS

Robert Staszewski et al., "All-Digital TX Frequency Synthesizer and Discrete-Time Receiver for Bluetooth Radio in 130-nm CMOS", IEEE Journal of Solid-State Circuits, vol. 39, No. 12, Dec. 2004, pp. 2278-2291.
Robert Staszewski et al., "All-Digital PLL and Transmitter for Mobile Phones", IEEE Journal of Solid-State Circuits, vol. 40, No. 12, Dec. 2005, pp. 2469-2482.

* cited by examiner

*Primary Examiner*—Robert Pascal
*Assistant Examiner*—Ryan Johnson
(74) *Attorney, Agent, or Firm*—Winston Hsu

(57) ABSTRACT

For decreasing errors within an analog phase-locked loop, an all-digital phase-locked loop (ADPLL) with digital components and digital operations is used. The ADPLL may also be used for direct frequency modulation (DFM). By defining a proportional path gain of an ADPLL by a bandwidth and a reference frequency of the ADPLL, by a TDC gain, a DCO gain, a dividing ratio of a frequency divider, a gain of an amplifier or a combination thereof, the gain of the amplifier may be adjusted so that an optimal loop bandwidth of the ADPLL may be well calibrated. For achieving the aim of entirely digital of the ADPLL, the gains of the TDC and the DCO may be further adjusted in a digital manner.

6 Claims, 13 Drawing Sheets

ALL-DIGITAL PHASE-LOCKED LOOP, LOOP BANDWIDTH CALIBRATION METHOD, AND LOOP GAIN CALIBRATION METHOD FOR THE SAME

CROSS REFERENCE TO RELATED APPLICATIONS

This application claims the priority of U.S. Provisional Application Nos. 60/980,172, filed on Oct. 16, 2007 and 60/980,461, filed on Oct. 17, 2007, which is included herein by reference.

BACKGROUND OF THE INVENTION

1. Field of the Invention

The present invention relates to an all-digital phase-locked loop (ADPLL) and a loop bandwidth calibration method used on the same.

2. Description of the Prior Art

A phase-locked loop (PLL) is an electronic control system that generates a signal that has a fixed relation to the phase of a reference signal. A phase-locked loop circuit responds to both the frequency and the phase of the input signals, and automatically raises or lowers the frequency of a controlled oscillator until it is matched to the reference signal in both frequency and phase. A conventional analog PLL includes a phase detector, a voltage-controlled oscillator (VCO), and a feedback path for feeding output signals of the VCO back to an input terminal of the phase detector so as to raise or lower a frequency of input signals of the analog PLL. Therefore, the frequency of the analog PLL may always catch up with a reference frequency of a reference signal applied by the phase detector, i.e., the frequency of the input signals of the analog PLL is always locked by the reference frequency of the reference signal. Moreover, a frequency divider is conventionally applied on the feedback path so that multiples of the reference frequency may always be retrieved. A low-pass filter is conventionally connected after the phase detector so that noises staying at higher frequencies may thus be filtered.

As known by those skilled in the art, the analog PLL easily has errors (or even error propagation) since said analog PLL uses analog operations and analog elements. Therefore, digital phase-locked loops (DPLL), which utilize a counter with a variable divisor on the feedback path, are proposed for relieving the errors with the partial aid of digital operations and digital elements, and moreover, an all-digital phase-locked loop (ADPLL) may significantly helps in area reduction and process migration. For example, a digital-controlled oscillator (DCO) may be used for in replace of the conventionally used VCO, which is an analog element. A phase detector may also be replaced with a time-to-digital converter. Therefore, the usage of the ADPLL is becoming a trend in radio communications.

SUMMARY OF THE INVENTION

The claimed invention discloses a loop bandwidth calibration method for an all-digital phase-locked loop (ADPLL). The loop bandwidth calibration method comprises calibrating a loop bandwidth of an ADPLL by adjustment of a gain of an amplifier of a proportional path module of the ADPLL according to a gain of a time-to-digital converter (TDC) of the ADPLL, a gain of a digital-controlled oscillator (DCO) of the ADPLL or a combination thereof.

The claimed invention also discloses an all-digital phase-locked loop (ADPLL). The ADPLL comprises a digital loop filter. The digital loop filter comprises a proportional path module for tracking variation of phase related to an outputted signal from a time-to-digital converter (TDC) module. The proportional path module comprises a proportional path module (PPM) amplifier. A gain of the PPM amplifier may be adjusted according to a gain of a TDC in the TDC module.

The claimed invention further discloses a loop gain calibration method for an all-digital phase-locked loop (ADPLL). The loop gain calibration method comprises modulating a gain of a sigma delta modulator compensation module (SDMCM) amplifier of a SDM compensation module according to a code variance corresponding to a half of a reference period of a reference signal received by a TDC module of the ADPLL, a reference frequency of the reference signal received by the TDC module, a frequency response of a DCO of a DCO/SDM module of the ADPLL or a combination thereof; and modulating a gain of a modulator (MOD) amplifier of a modulator according to a frequency variance in the input terminal of a SDM of a feedback path module of the ADPLL, a code variance corresponding to the frequency variance, a fractional code variance, the reference frequency of the reference signal received by the TDC module, or a combination thereof.

These and other objectives of the present invention will no doubt become obvious to those of ordinary skill in the art after reading the following detailed description of the preferred embodiment that is illustrated in the various figures and drawings.

DETAILED DESCRIPTION

The present invention discloses an ADPLL for Dynamic Frequency Modulation (DFM) with fine gain calibration, where the disclosed ADPLL uses some newly-proposed elements and techniques herein. With the aid of the disclosed ADPLL, switching noises may be significantly reduced, and a loop gain of the ADPLL may also be precisely and finely tuned.

Figure 1:
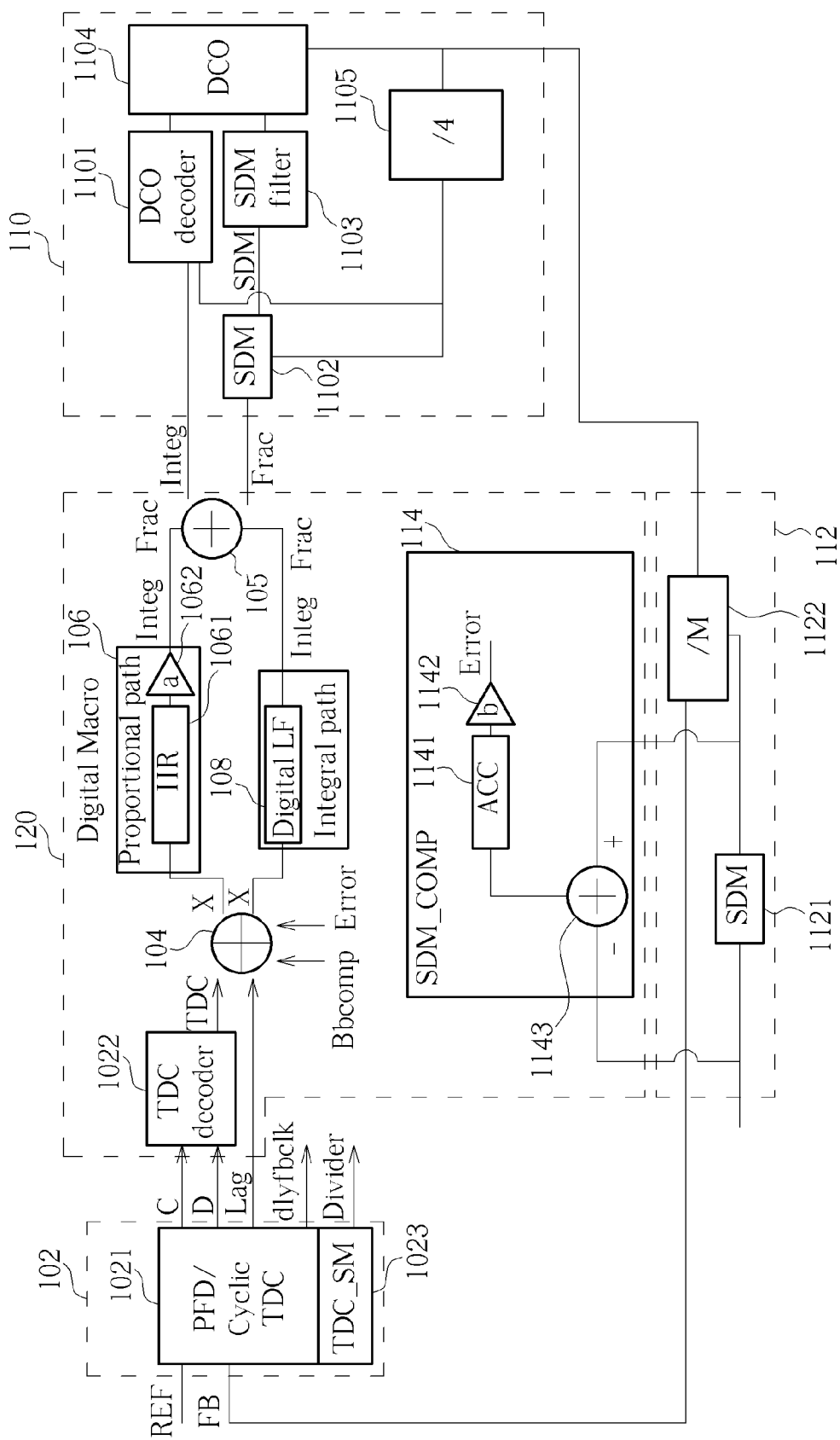
FIG. 1 is a diagram of an ADPLL disclosed in the present invention.

Please refer to FIG. 1, which is a diagram of an ADPLL 100 disclosed in the present invention. As shown in FIG. 1, ADPLL 100 includes a time-to-digital converter (TDC) module 102, a digital macro module 120, a digital-controlled oscillator (DCO)/sigma-delta modulator (SDM) module 110, and a feedback path module 112. The TDC module 102 includes a phase-frequency detector/cyclic time-to-digital converter (PFD/CTDC) module 1021 and a TDC state machine (TDC_SM) 1023. Though a cyclic TDC is employed in the embodiments hereinafter, any type of TDC may be applied to the invention. The digital macro module 120 includes a TDC decoder 1022, a first adder 104, a proportional path module 106, a digital low-pass filter (digital LF) 108, a second adder 105, and a SDM compensation module 114. The proportional path module 106 includes an infinite impulse response (IIR) module 1061 and a proportional path module (PPM) amplifier 1062. Note that a gain of the PPM amplifier 1062 is a. The digital low-pass filter 108 serves as an integral path in the ADPLL 100. The SDM compensation module 114 includes a first accumulator 1141, a sigma-delta modulator compensation module (SDMCM) amplifier 1142 with a gain b, and a third adder 1143. Note that the SDM compensation module 114 may also be referred as an error compensation module. The DCO/SDM module 110 includes a DCO decoder 1101, a first SDM 1102, a SDM filter 1103, a DCO 1104, and a first frequency divider 1105. Note that though a divider of the first frequency divider 1105 used and shown in FIG. 1 is 4, a value of the used divider may be other values other than 4 and be used in other embodiments of the present invention. The feedback path module 112 includes a second SDM 1121 and a second frequency divider 1122. Note that a divider used in the frequency divider 1122 is M, which is a variable.

As shown in FIG. 1, the TDC module 102 receives a reference signal REF and a feedback signal FB, and generate a cycle signals C and a data signal D, both of which carry phase information and frequency information related to the feedback signal FB. Note that the cycle signal C indicates a currently-used cycle of a cyclic time-to-digital converter (CTDC) within the PFD/CTDC module 102. Note that the data signal D indicates data generated by D flip-flops within the PFD/CTDC module 102. Note that the cycle signal C and the data signal D are then decoded by the TDC decoder 1022 so as to generate an output signal TDC within the digital macro module 120, where the output signal TDC also carries phase information and frequency information related to the feedback signal FB. The first adder 104 adds the output signal TDC with the error signal Error, which is in fact an error compensation signal, for canceling the possible error within the output signal TDC to a certain degree, and outputs a signal X to both the proportional path module 106 and the digital LF 108. Note that a self-test signal Bbcomp and a sign signal Lag, which is generated from the PFD/CTDC module 1021, are also added for carrying information about whether to raise or lower a frequency of an output signal of the DCO/SDM module 110. Also note that the PFD/CTDC module 1021 outputs a clock signal dlyfbclk to manipulate a built-in clock of the digital macro module 120. The TDC state machine 1023 also generates a divider signal Divider to carry divider-related information to the digital macro module 120.

The proportional path module 106 is responsible for tracking variations of the phase of the signal X, whereas the digital low-pass filter 108, i.e. the integration path, is responsible for tracking long-term frequency drifts of said signal X. The digital macro module 104 outputs an integer signal Integ and a fractional signal Frac to the DCO/SDM module 110.

In the DCO/SDM module 110, the DCO decoder 1101 has a first input terminal for receiving the integer signal; the first SDM 1102 has a first input terminal for receiving the fractional signal; the SDM filter 1103 has an input terminal coupled to an output terminal of the first SDM 1102; the DCO 1104 has a first input terminal coupled to an output terminal of the DCO decoder 1101, and a second input terminal coupled to an output terminal of the SDM filter 1103; and the first frequency divider 1105 has an input terminal coupled to an output terminal of the DCO 1104, and an output terminal coupled to both a second input terminal of the DCO decoder 1101 and a second input terminal of the first SDM 1102. Note that a first loop passing though the DCO decoder 1101, the DCO 1104, and the first frequency divider 1105 is responsible for modulating the integer signal Integ, whereas a second loop passing through the first SDM 1102, the SDM filter 1103, the DCO 1104, and the frequency divider 1105 is responsible for modulating the fractional signal Frac.

The feedback path nodule 112 cooperates with the SDM compensation module 114, which is included in the digital macro module 120. The second divider 1122 is used for dividing the frequency of a signal outputted from the DCO/SDM module 110, and cooperates with the second SDM 1121. The SDM compensation module 114 is utilized for predicting possible errors of the signal outputted from the DCO/SDM module 110 and inputting the predicted errors, which are carried in the error compensation signal, into the first adder 104 in a feed-forward manner so that errors from the signal TDC are significantly reduced. Note that the third adder 1143 has a positive input terminal coupled to an input terminal of the second SDM 1121, a negative input terminal coupled to an output terminal of the second SDM 1121, and an output terminal coupled to an input terminal of the first accumulator 1141.

Characteristics of a structure of the ADPLL 100 primarily lie in the existences of the proportional path module 106, the digital low-pass filter 108, and the SDM compensation module 114 since the listed elements are highly related to fine calibration of a loop gain of the ADPLL 100. However, all the included elements, modules, and signals are digital so that the ADPLL 100 is entirely controlled digitally, and as a result, an accurate bandwidth control is achieved with the aid of the all-digital control mechanism. The ADPLL 100 also works in reducing switching noises, though detailed techniques will be explained later.

Figure 2:
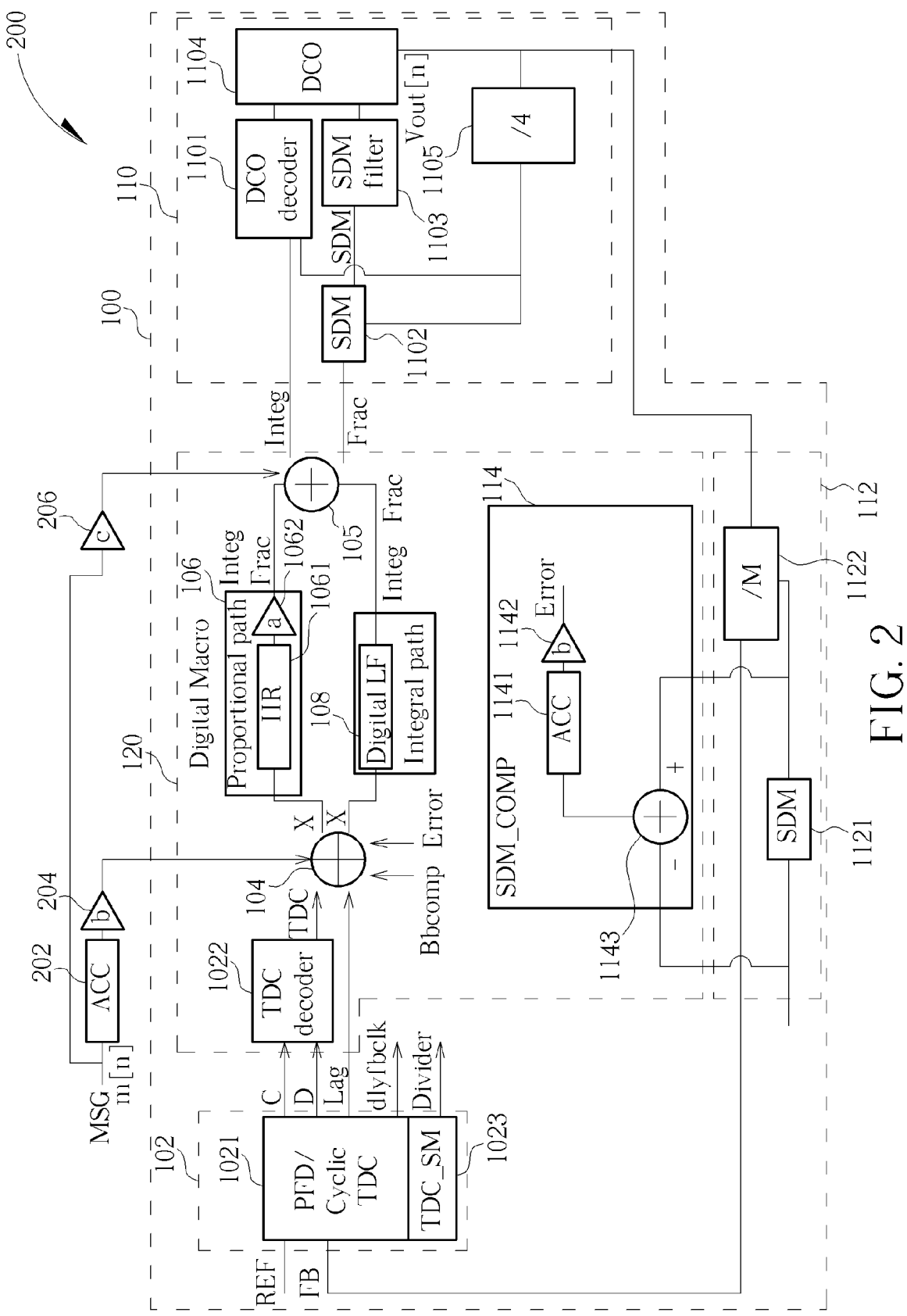
FIG. 2 is a diagram of a DFM ADPLL based on the ADPLL disclosed in FIG. 1 of the present invention.

A primary usage of the ADPLL 100 is to implementing an all-digital architecture of direct-frequency modulation (DFM). Please refer to FIG. 2, which is a diagram of a DFM ADPLL 200 based on the ADPLL 100 disclosed in FIG. 1 of the present invention. As shown in FIG. 2, besides the ADPLL 100, a second accumulator 202, an accumulator (ACC) amplifier 204, which cooperates with the second accumulator 202 and uses a same gain b as the SDMCM amplifier 1142, and a modulator (MOD) amplifier 206, which uses a gain c. A message MSG, which is in fact a modulation signal, is inputted to the second accumulator 202 and the MOD amplifier 206 so as to be fed into both the first adder 104 and the second adder 105 in a feed-forward manner. Note that a combination of the second accumulator 202 and the ACC amplifier 204 acts a high-pass filter for the message MSG. Also note that the DCO/SDM module 110 gives a low-pass response to the message MSG, where a VCO in a conventional PLL gives an upper bound of the frequency domain of the message MSG, i.e., the VCO acts as a low-pass filter so that the frequency domain of the message MSG is restricted by the low-pass filter. By combining the abovementioned high-pass and low-pass responses, an all-pass response may be retrieved so that wide band modulation or independence from a bandwidth of PLL is achieved. In manipulating the all-pass response, values of the gains b and c have to be well adjusted. Note that the purpose of wide-band modulation is achieved since a frequency domain of the message MSG is not restricted in or related to the DFM ADPLL 200 with the aid of the all-pass response. A pre-distortion technique used in the conventional PLL for distorting noises in advance is also avoided in the ADPLL 200 of the present invention, where elements for implementing the pre-distortion technique conventionally occupy large areas.

The technique in modulating values of the gains b and c is described as follows. Please refer to FIG. 2, and a loop gain of the DFM ADPLL 200 may be derived by using an input response m[n] in the message MSG to derive a corresponding output frequency response $V_{out}[n]$ as an output response at the DCO/SDM module 110. A loop gain of the DFM ADPLL 200 is indicated by $$\frac{V_{out}[n]}{m[n]},$$

a response of which is derived as follows:

$$\frac{V_{out}[n]}{m[n]} = \frac{c \cdot Kv + b \cdot L(z) \cdot Kv}{1 + \frac{1}{TDC \cdot Fref^2} \cdot L(z) \cdot Kv \cdot \frac{1}{M} \cdot \frac{Z^{-1}}{1 - Z^{-1}}} = 1 \quad (1)$$

while the DFM ADPLL 200 is to be modulated with an all-pass state. Some conditions used in the equation (1) are simply explained as follows. The term $c \cdot Kv$ indicates a response of a path including the MOD amplifier 206 and the DCO/SDM module 110, where Kv is a gain of the DCO/SDM module 110, i.e., a gain of the DCO 1104. The term $b \cdot L(z) \cdot Kv$ indicates a response of a path including a combination of the second accumulator 202 and the ACC amplifier 204, the digital low-pass filter 108, and the DCO/SDM module 110, where a response of the digital low-pass filter 208 is L(z). The term $$\frac{1}{TDC \cdot Fref^2}$$

is a gain of the TDC module 102, where Fref is a reference frequency of the reference signal REF, and TDC indicates a gain of a Cyclic TDC within the PFD/CTDC module 1021.

$$\frac{1}{M}$$

is a response of the second frequency divider 1122.

$$\frac{Z^{-1}}{1 - Z^{-1}}$$

indicates a frequency response of the DCO 1104.

As can be observed from the equation (1), for satisfying the all-pass state, the values of both the gains b and c are derived by the following equations:

$$c \cdot Kv = 1 \quad (2)$$

$$b \cdot L(z) \cdot Kv = \frac{1}{TDC \cdot Fref^2} \cdot L(z) \cdot Kv \cdot \frac{1}{M} \cdot \frac{Z^{-1}}{1 - Z^{-1}} \quad (3)$$

By inductions, the values of both the gains b and c may be indicated as follows:

$$c = \frac{1}{Kv} \quad (4)$$

$$b = \frac{1}{TDC \cdot Fref^2} \cdot \frac{1}{M} \cdot \frac{Z^{-1}}{1 - Z^{-1}} \quad (5)$$

For achieving the aim of the all-digital controlling mechanism, complete manipulations of values of both the gains b and c are necessary. To manipulate the gain b, the value of the TDC gain TDC has to be controllable as well. A definition of the TDC gain TDC is defined as a resolution of the TDC module 102, i.e., a time variance $\Delta t$ over a code variance $\Delta N$, so that the TDC gain TDC is derived as follows:

$$TDC = \frac{\Delta t}{\Delta N} = \frac{\frac{1}{2}Tref}{N_1} = \frac{1}{2Fref \cdot N_1} \quad (6)$$

Note that the code variance $N_1$ corresponds to a half of a reference period Tref of the reference signal, in which a positive state and a negative state occupy one half of the reference period Tref in turn. With the equation (6), the value of the gain b may be rewritten as follows:

$$b = \frac{1}{\frac{1}{2 \cdot Fref \cdot N_1} \cdot Fref^2} \cdot \frac{1}{M} \cdot \frac{Z^{-1}}{1 - Z^{-1}} = \frac{2N_1}{M} \cdot \frac{1}{Fref} \cdot \frac{Z^{-1}}{1 - Z^{-1}} \quad (7)$$

To manipulate the value of the gain c, the DCO gain Kv is required to be controllable. The DCO gain Kv may be used for deriving the gain c as follows:

$$c = \frac{1}{Kv} = \frac{\Delta I}{\Delta N \cdot Fref} \quad (8)$$

The term $\Delta N \cdot Fref$ indicates a frequency variance in a signal at the input terminal of the second SDM 1121, and a code variance $\Delta I$ corresponding to the frequency variance $\Delta N \cdot Fref$ is retrieved in the output signal of the digital low-pass filter 208, where ΔN indicates a fractional code variance. Since the terms ΔN·Fref and ΔI are controllable, the value of the gain c should also be controllable as well. Fine and delicate modulation of the loop gain of the DFM ADPLL 200 is thus complete.

The DCO 1104 is utilized for tracking a frequency band of an output signal of the digital macro module 120 according to both an integer signal and a fractional signal within the output signal. The integer signal is decoded by the DCO decoder 1101, and the fractional signal is retrieved with the aid of both the SDM 1102 and the SDM filter 1103. Operations of both the SDM 1102 and the SDM filter 1103 are similar with a conventional SDM and SDM filter so that the operations are not further described. Use of a conventional DCO within embodiments is also intended to be within the scope of the current disclosure, however the DCO 1104 preferably is specifically designed and proposed in the present invention for the frequency band tracking and avoiding a significant frequency discontinuity. Please refer to FIG. 3, which is a detailed diagram of the DCO 1104 illustrated in FIG. 1 and FIG. 2 and proposed in the present invention. The DCO 1104 includes an on-chip low-drop-out (LDO) regulator 302, which could be excluded from the DCO if the targeted application permits, an inductor/resistor module 304 coupled to the LDO regulator 302, a process/voltage/temperature (PVT) tank 306 coupled to the inductor/resistor set 304, an acquisition tank (ACQ) 308 coupled to the PVT tank 306, and a tracking tank (TRK) 310 coupled to the acquisition tank 308. Elements other than the tracking tank 310 may be implemented conventionally so that the elements are merely and simply described as follows. The on-chip LDO regulator 302 generates a required voltage VCCreg for the DCO 1104 according to a voltage VCC. The inductor/resistor set 304 includes inductors, switchable resistors, and a negative gm cell 3042, for setting current consumption and oscillation amplitudes of the DCO 1104, for improving common-mode rejection, and for reducing noises and spurs generated from grounds of the DCO 1104. The PVT tank 306 is provided for compensating process/voltage/temperature variations. The acquisition tank 308 is provided for fast frequency acquisition.

Figure 3:
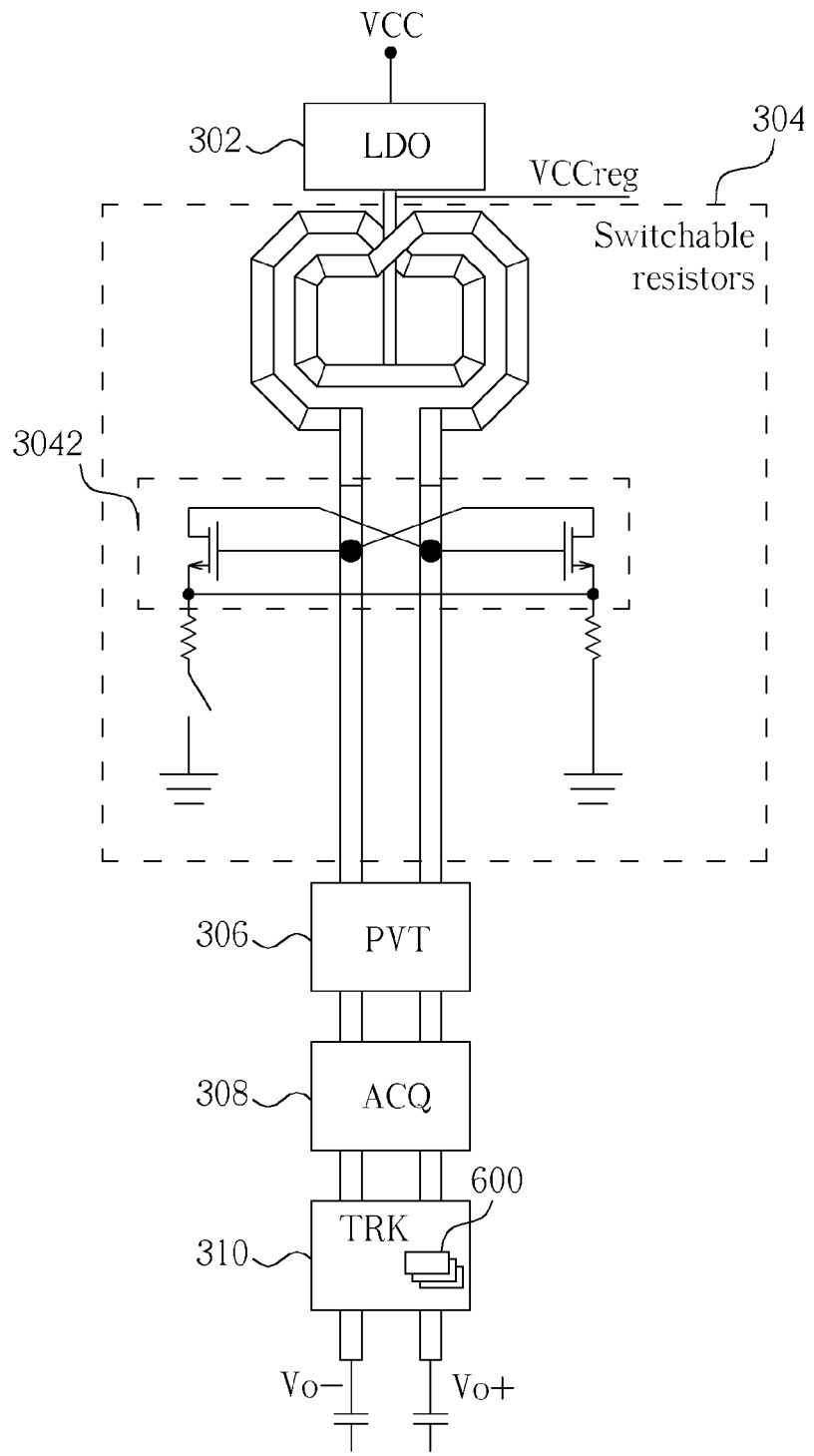
FIG. 3 is a detailed diagram of the DCO illustrated in FIG. 1 and FIG. 2 and proposed in the present invention.
Figure 4:
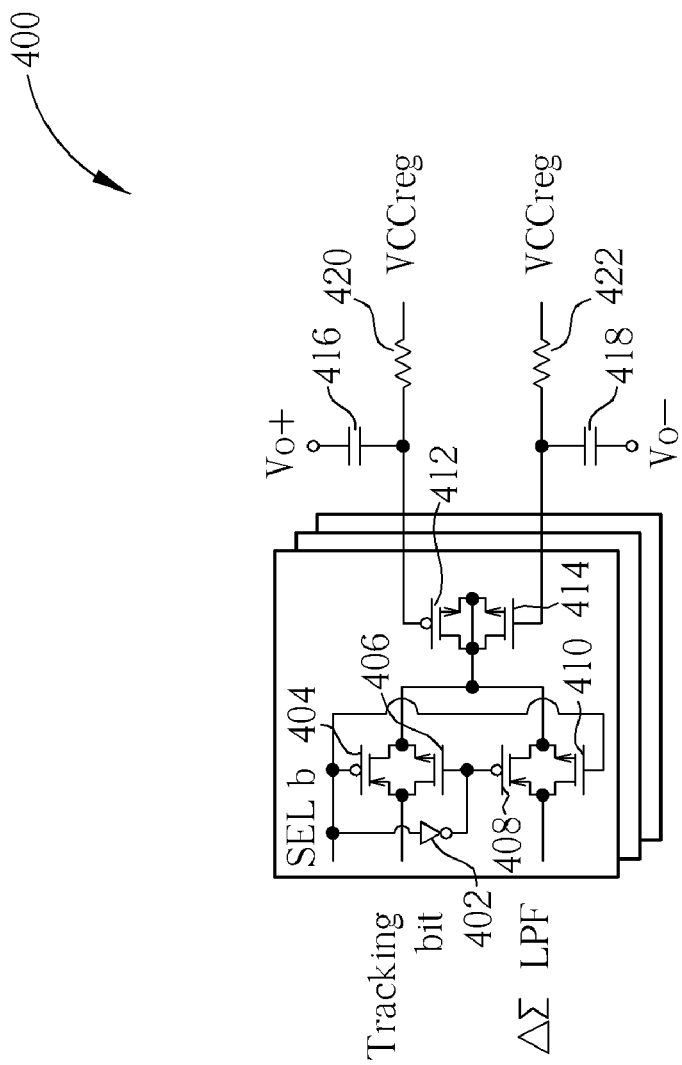
FIG. 4 is a diagram of a cell of a conventional tracking tank.
Figure 5:
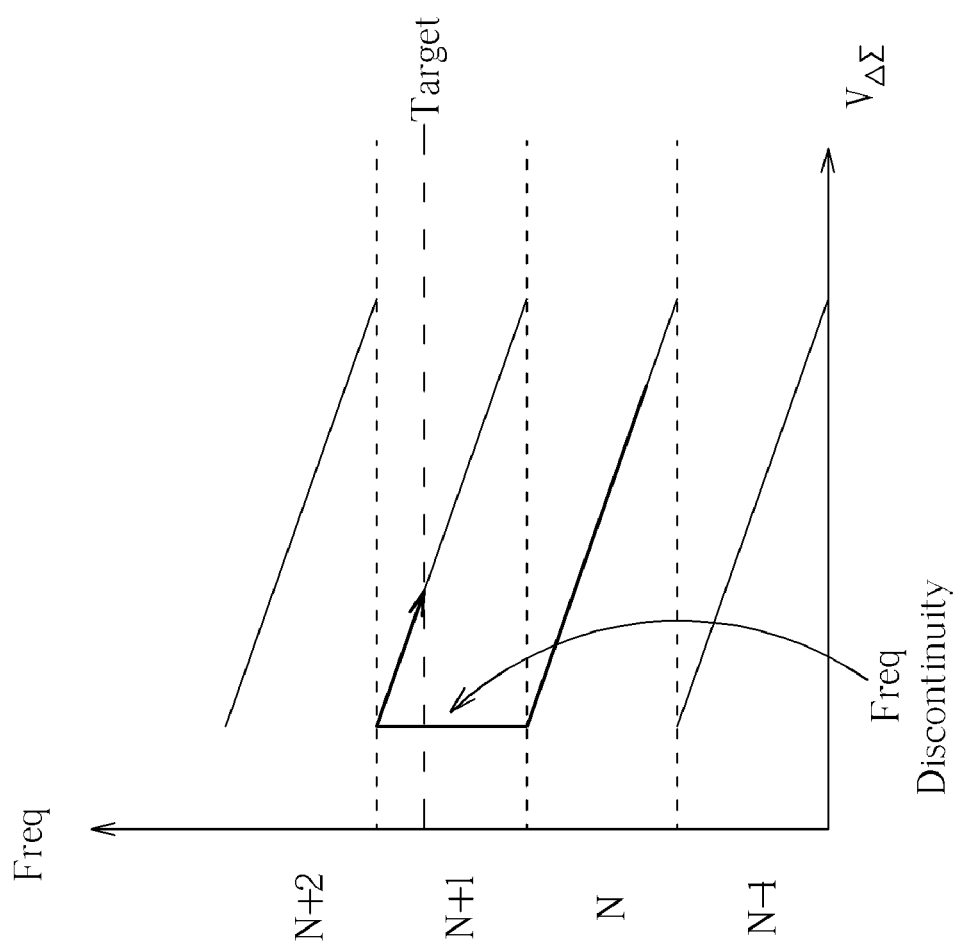
FIG. 5 is a plot of a voltage-frequency transfer curve related to the cell of the conventional tracking tank illustrated in FIG. 4.
Figure 6:
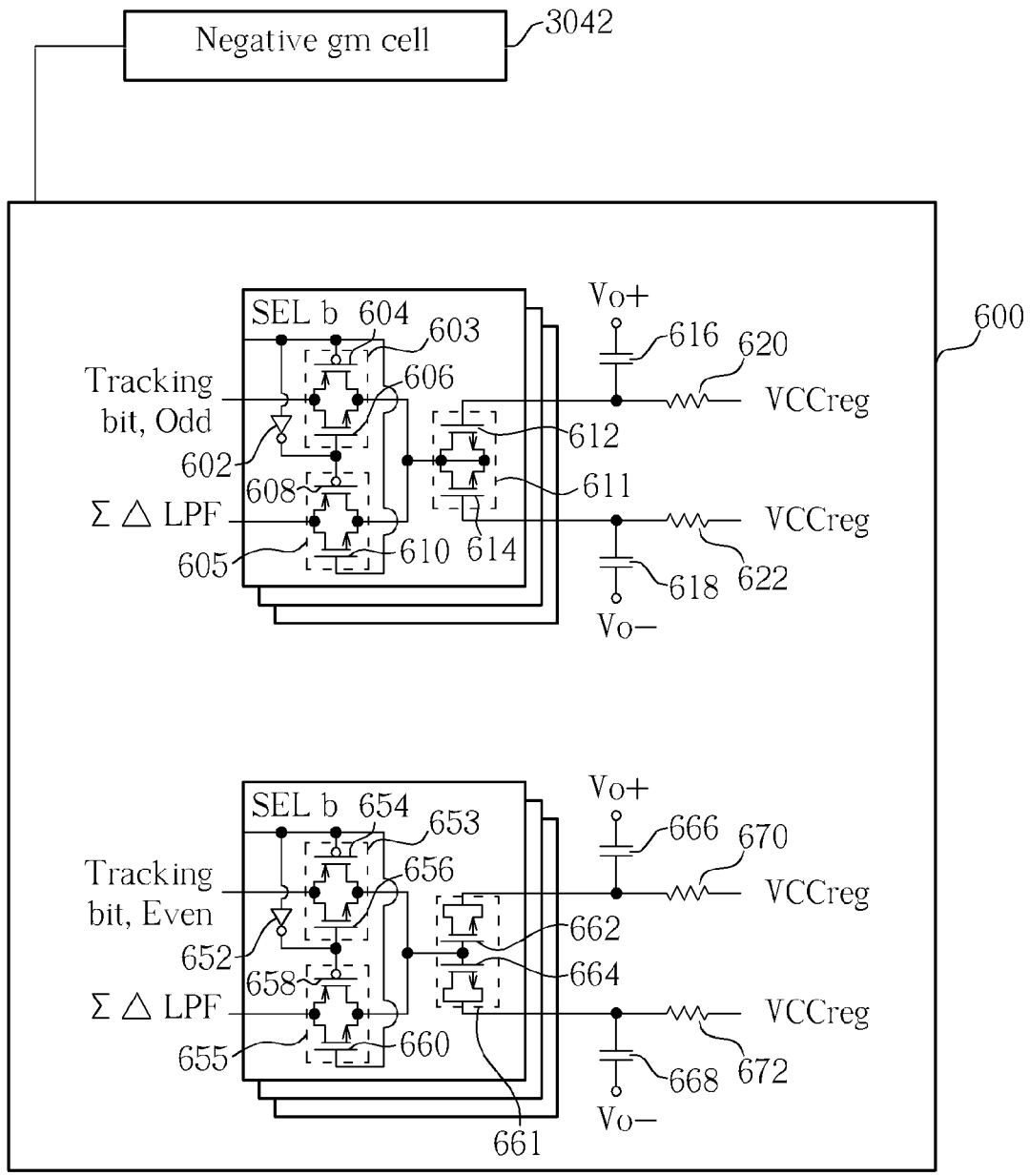
FIG. 6 is a detailed diagram of a cell of the tracking tank illustrated in FIG. 3.
Figure 7:
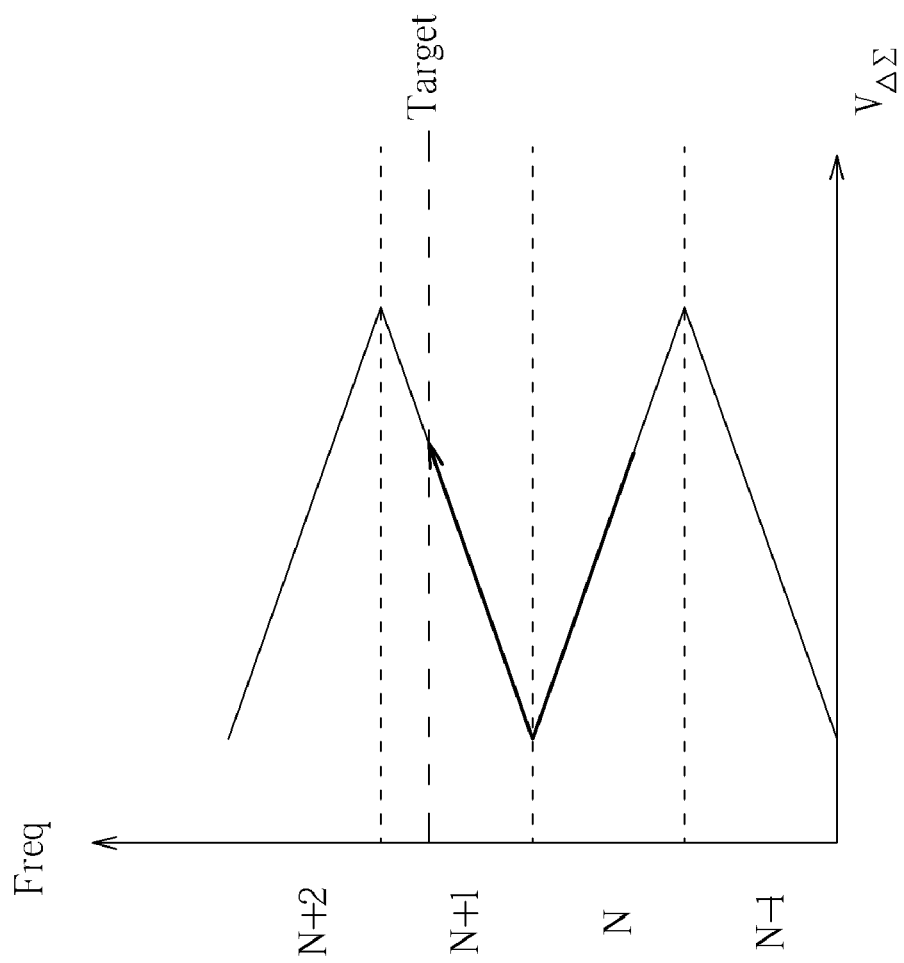
FIG. 7 is a plot of a folded voltage-frequency transfer curve related to the cell f the tracking tank illustrated in FIG. 6.

Primary characteristics of the DCO 104 lie in the tracking tank 310. Before disclosing the tracking tank 310 in detail, a conventional tracking tank is introduced herein for explaining advantages of the tracking tank 310. Please refer to FIG. 4, FIG. 5, FIG. 6, and FIG. 7. FIG. 4 is a diagram of a cell 400 of a conventional tracking tank. FIG. 5 is a plot of a voltage-frequency transfer curve related to the cell 400 of the conventional tracking tank illustrated in FIG. 4. FIG. 6 is a detail diagram of a cell 600 of the tracking tank 310 illustrated in FIG. 3. FIG. 7 is a plot of a folded voltage-frequency transfer curve related to the cell 600 of the tracking tank 310 illustrated in FIG. 6.

As shown in FIG. 4, the cell 400 of the conventional tracking tank includes an inverter 402, a first P-type MOSFET 404, a first N-type MOSFET 406, a second P-type MOSFET 408, a second N-type MOSFET 410, a third N-type MOSFET 412, a fourth N-type MOSFET 414, a first capacitor 416, a second capacitor 418, a first resistor 420, and a second resistor 422. Couplings of the above-listed elements are shown on FIG. 4 so that the couplings are not described for brevity. The voltage VCCreg is inputted at both the resistors 420 and 422. A bit, which may be odd or even for indicating a digital integer signal from the DCO decoder 1101, is inputted to a set including the first P-type MOSFET 404 and the first N-type MOSFET 406. A SDM fractional signal, which may also be regarded as a primary voltage, from the SDM filter 1103 is inputted to a set including both the second P-type MOSFET 408 and the second N-type MOSFET 410. A pair including a high output voltage Vo+ and a low output voltage Vo− is outputted for indicating oscillations of the conventional tracking tank. In brief, every time when a related integer signal is incremented by 1, the SDM fractional signal is decremented by 1 so that an average of the SDM fractional signal stays below 1 (or near zero). However, since the inputted bit keeps on changing between 0 and 1, every time when the integer signal is incremented by 1 instantly, a speed of decrementing the SDM fractional signal cannot catch up with the increment of the integer signal. Therefore, as shown in FIG. 5, a frequency discontinuity happens while the integer value is incremented from N to (N+1) since the SDM fractional signal cannot be adjusted (or be accordingly decreased) to reach the Target, which is shown in FIG. 5, until the integer value (N+1) is reached.

The cell 600 of the tracking tank 310 is disclosed herein for solving such discontinuity. The cell 600 splits operations of the odd and even bits into two different sets, i.e., an odd set and an even set, so that the transfer curve shown in FIG. 7 is folded without a frequency jump, which indicates a procedure in reaching the Target after reaching the integer value (N+1).

As shown in FIG. 6, the cell 600 includes a first tracking set for handling the odd bit and a second tracking set for handling the even bit. Note that in other embodiments of the present invention, the first tracking set may also be utilized for handling the even bit, whereas the second tracking set is utilized for handling the odd bit. The first tracking set includes a first inverter 602, a first digital module 603 for processing odd digital bits from the DCO decoder 1101, a first analog module 605 for processing SDM fractional signals from the SDM filter 1103, and a first capacitance module 611 for brining required capacitance to output voltages Vo+ and Vo−. The first digital module 603 includes a first P-type MOSFET 604 and a first N-type MOSFET 606. The first analog module 605 includes a second P-type MOSFET 608 and a second N-type MOSFET 610. The first capacitance module 611 includes a third N-type MOSFET 612 and a fourth N-type MOSFET 614. The first tracking set further includes a first capacitor 616, a second capacitor 618, a first resistor 620, and a second resistor 622. Note that components of the first digital module 603, the first analog module 605, and the first capacitance module 611 are not restricted by those shown in FIG. 6 in other embodiments of the present invention. The second tracking set includes a second inverter 652, a second digital module 653 for processing even digital bits from the DCO decoder 1101, a second analog module 655 for processing SDM fractional signals from the SDM filter 1103, and a second capacitance module 661 for brining required capacitance to output voltages Vo+ and Vo−. The second digital module 653 includes a third P-type MOSFET 654 and a fifth N-type MOSFET 656. The second analog module 655 includes a fourth P-type MOSFET 658 and a sixth N-type MOSFET 660. The second capacitance module 661 includes a seventh N-type MOSFET 662 and an eighth N-type MOSFET 664. The second tracking set further includes a third capacitor 666, a fourth capacitor 668, a third resistor 670, and a fourth resistor 672.

The first inverter 602 has a positive terminal for receiving the selection signal SEL. The first P-type MOSFET 604 has a gate coupled to the positive terminal of the first inverter 602, and a source for receiving the odd bit. The first N-type MOSFET 606 has a drain coupled to the source of the first P-type MOSFET 604, and a source coupled to a drain of the first P-type MOSFET 604. The second P-type MOSFET 608 has a gate coupled to both a negative terminal of the first inverter 602 and a gate of the first N-type MOSFET 606. The second N-type MOSFET 610 has a drain coupled to a source of the second P-type MOSFET 608 for receiving signals from a sigma-delta low-pass filter, to a drain of the second P-type MOSFET 608, and to the source of the first N-type MOSFET 606, has a source coupled to a drain of the second P-type MOSFET 608, and has a gate coupled to the gate of the first P-type MOSFET 604. The third N-type MOSFET 612 has a source coupled to the source of the first N-type MOSFET 606, and a drain coupled to the source of the third N-type MOSFET 612. The fourth N-type MOSFET 614 has a drain coupled to the source of the third N-type MOSFET 612, and a source coupled to the drain of the third N-type MOSFET 612. The first capacitor 616 has a first terminal coupled to a gate of the third N-type MOSFET 612 and a second terminal for outputting a first high output voltage. The second capacitor 618 has a first terminal coupled to a gate of the fourth N-type MOSFET 614, and a second terminal for outputting a first low output voltage. The first resistor 620 has a first terminal coupled to the first terminal of the first capacitor 616, and a second terminal for receiving the generated required voltage from the LDO regulator. The second resistor 622 has a first terminal coupled to the first terminal of the second capacitor 618, and a second terminal for receiving the generated required voltage from the LDO regulator. The second tracking set comprises a second inverter 652, a third P-type MOSFET 654, a fifth N-type MOSFET 656, a fourth P-type MOSFET 658, a sixth N-type MOSFET 660, a seventh N-type MOSFET 662, an eighth N-type MOSFET 664, a third capacitor 666, a fourth capacitor 668, a third resistor 670, and a fourth resistor 672. The second inverter 652 has a positive terminal for receiving the selection signal. The third P-type MOSFET 654 has a gate coupled to the positive terminal of the second inverter 652, and a source for receiving the even bit. The fifth N-type MOSFET 656 has a drain coupled to the source of the P-type MOSFET, a source coupled to a drain of the third P-type MOSFET 654, and a gate coupled to a negative terminal of the second inverter 652. The fourth P-type MOSFET 658 has a gate coupled to the gate of the fifth N-type MOSFET 656, a source for receiving signals from a sigma-delta low-pass filter, and a drain coupled to the source of the fifth N-type MOSFET 656. The sixth N-type MOSFET 660 has a drain coupled to the source of the fourth P-type MOSFET 658, a source coupled to the drain of the fourth P-type MOSFET 658, and a gate coupled to the gate of the third P-type MOSFET 654. The seventh N-type MOSFET 662 has a gate coupled to the source of the fifth N-type MOSFET 656, a source, and a drain coupled to the source of the seventh N-type MOSFET 662. The eighth N-type MOSFET 664 has a gate coupled to the gate of the seventh N-type MOSFET 662, a source, and a drain coupled to the source of the eighth N-type MOSFET 664. The third capacitor 666 has a first terminal coupled to the drain of the seventh N-type MOSFET 662, and a second terminal for outputting a second high voltage. The fourth capacitor 668 has a first terminal coupled to the drain of the eighth N-type MOSFET 664, and a second terminal for outputting a second low voltage. The third resistor 670 has a first terminal coupled to the first terminal of the third capacitor 666, and a second terminal for receiving the generated required voltage of the LDO regulator. The fourth resistor 672 has a first terminal coupled to the first terminal of the fourth capacitor 668, and a second terminal for receiving the generated required voltage of the LDO regulator. Both the first high output voltage and the first low output voltage indicate oscillations in the odd bit of the tracking tank. Both the second high output voltage and the second low output voltage indicate oscillations in the even bit of the tracking tank.

The negative gm cell 3042 feeds control signals into each the cell 600 for brining required positive feedback in stabilizing oscillations in the output voltages Vo+ and Vo−. With predetermined control signals at the nodes SEL and b shown in FIG. 6 and the inverter 602 (or the inverter 652), at one time, merely one among the first digital module 603 and the first analog module 605 (or merely one among the second digital module 653 and the second analog module 655) is switched on, i.e., control voltage parity is brought herein. Therefore, operations related to integer signals and fractional signals may be separated and independent for fulfilling the mechanism shown in FIG. 5. Note that compositions and components of the negative gm cell 3042 are not restricted as shown in FIG. 3.

Note that a capacitance generated from the first capacitance module 611 has to be opposite to a capacitance generated from the second capacitance module 661 respectively for the odd and even bits, and such an opposition lead to two mutually-inverse curves corresponding to output voltages Vo+ and Vo− of both the first tracking set and the second tracking set. As shown in FIG. 7, while the integer value is incremented by 1, the curve goes on a reverse path with respect to the curve shown in FIG. 5 so that the frequency discontinuity is eliminated. As a result, undesired spurs disappear as well, and a related phase is thus continuously locked.

Then turn to the subject of digital loop bandwidth calibration of the ADPLL 100 (or 200). For explaining digital loop bandwidth calibration of the ADPLL 100, a simplified diagram of the ADPLL 100 has to be illustrated in advance. Please refer to FIG. 8, which is a simplified diagram of the ADPLL 100 shown in FIG. 1 for explaining the digital loop bandwidth calibration of said ADPLL 100. Note that the ADPLL 100 may be regarded as a high-resolution frequency-to-digital converter (FDC) at this time. A key to implement the digital loop bandwidth calibration is to calibrate the value of the gain a since other related variables are controllable, where the point will be proved later. A definition of the loop bandwidth is a proportional path gain of the proportional path module 106 multiplied by $$\frac{Fref}{2\pi}.$$

Therefore, the proportional path gain Pgain may be represented as follows:

$$Pgain = \frac{BW \cdot 2\pi}{Fref} \quad (9)$$

where the term BW indicates the loop bandwidth of the ADPLL 100. By observing the simplified diagram shown in FIG. 8, the proportional path gain Pgain may also be represented as:

$$Pgain = \frac{1}{TDC} \cdot a \cdot DCO \cdot \frac{1}{M} \cdot \frac{1}{Fref^2} \quad (10)$$

Figure 8:
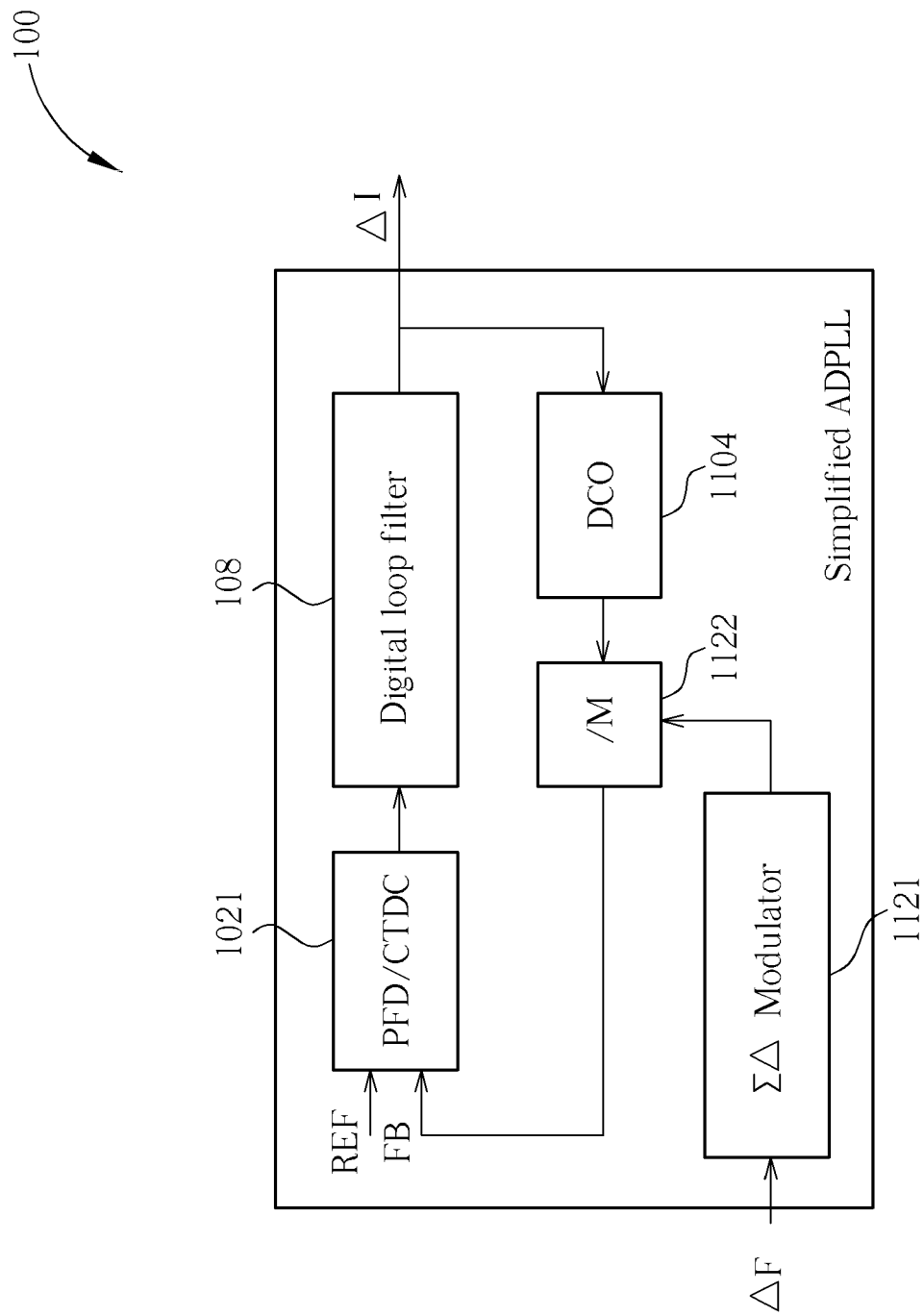
FIG. 8 is a simplified diagram of the ADPLL shown in FIG. 1 for explaining the digital loop bandwidth calibration of said ADPLL.

Definitions of variables in the equation (10) are the same with the abovementioned functions so that the definitions are not described repeatedly. The term $$\frac{1}{TDC}$$

indicates a variance of codes from the PFD/CTDC module 1021 in unit time. The gain a of the PPM amplifier 106 is regarded as a gain of the digital low-pass filter 108 at this time. Note that the term $$\frac{1}{TDC} \cdot a$$

indicates a variance of codes at the output terminal of the digital low-pass filter 108, i.e., a code variance ΔI shown in FIG. 8. The term $$\frac{1}{TDC} \cdot a \cdot DCO$$

indicates a frequency variance $\Delta f_c$ resulted from the variance of codes, i.e., the code variance ΔI. The term $$\frac{1}{TDC} \cdot a \cdot DCO \cdot \frac{1}{M}$$

indicates the frequency variance Δf divided by the dividing ratio M of the second frequency divider 122. At last, note that the proportional path gain Pgain indicates a time drift $\Delta t_c$ resulted by a code variance with respect to a unit time. A reference period $$Tref = \frac{1}{Fref}$$

is also noted so that the following equation is satisfied:

$$\frac{\Delta t_c}{Tref} = \frac{\Delta f_c}{Fref} \qquad (11)$$

The time drift $\Delta t_c$ may be inducted as:

$$Pgain = \Delta t_c \qquad (12)$$
$$= \frac{\Delta f_c}{Fref} \cdot \frac{1}{Fref}$$
$$= \frac{\Delta f_c}{Fref^2}$$
$$= \frac{\Delta f}{M} \cdot \frac{1}{Fref^2}$$

-continued
$$= \frac{1}{TDC} \cdot a \cdot DCO \cdot \frac{1}{M} \cdot \frac{1}{Fref^2}$$

The equation (12) explains how the equation (10) is inducted. Note that the gain DCO may also be referred as the gain Kv. By combining the equation (9) and (10), and refer to both the equations (6) and (8), the gain a may be inducted with the follow equations:

$$\frac{1}{TDC} \cdot a \cdot Kv \cdot \frac{1}{M} \cdot \frac{1}{Fref^2} = Pgain = \frac{BW \cdot 2\pi}{Fref} \qquad (13)$$

and $$a = \frac{TDC \cdot M \cdot Fref^2 \cdot BW \cdot 2\pi}{Kv \cdot Fref} \qquad (14)$$
$$= \frac{TDC \cdot M \cdot Fref \cdot BW \cdot 2\pi}{Kv}$$
$$= \frac{1}{2Fref \cdot N_1} \cdot M \cdot Fref \cdot BW \cdot 2\pi \cdot \frac{\Delta I}{\Delta N \cdot Fref}$$
$$= \frac{\Delta I \cdot M \cdot BW \cdot 2\pi}{2N_1 \cdot Fref \cdot \Delta N}$$

Variables related to the gain a in the equation (14) have been proved above to be controllable so that the gain a is controllable as well. In other words, by adjusting the value of the gain a according to the equation (14), the loop bandwidth calibration of the ADPLL 100 is feasible.

Figure 9:
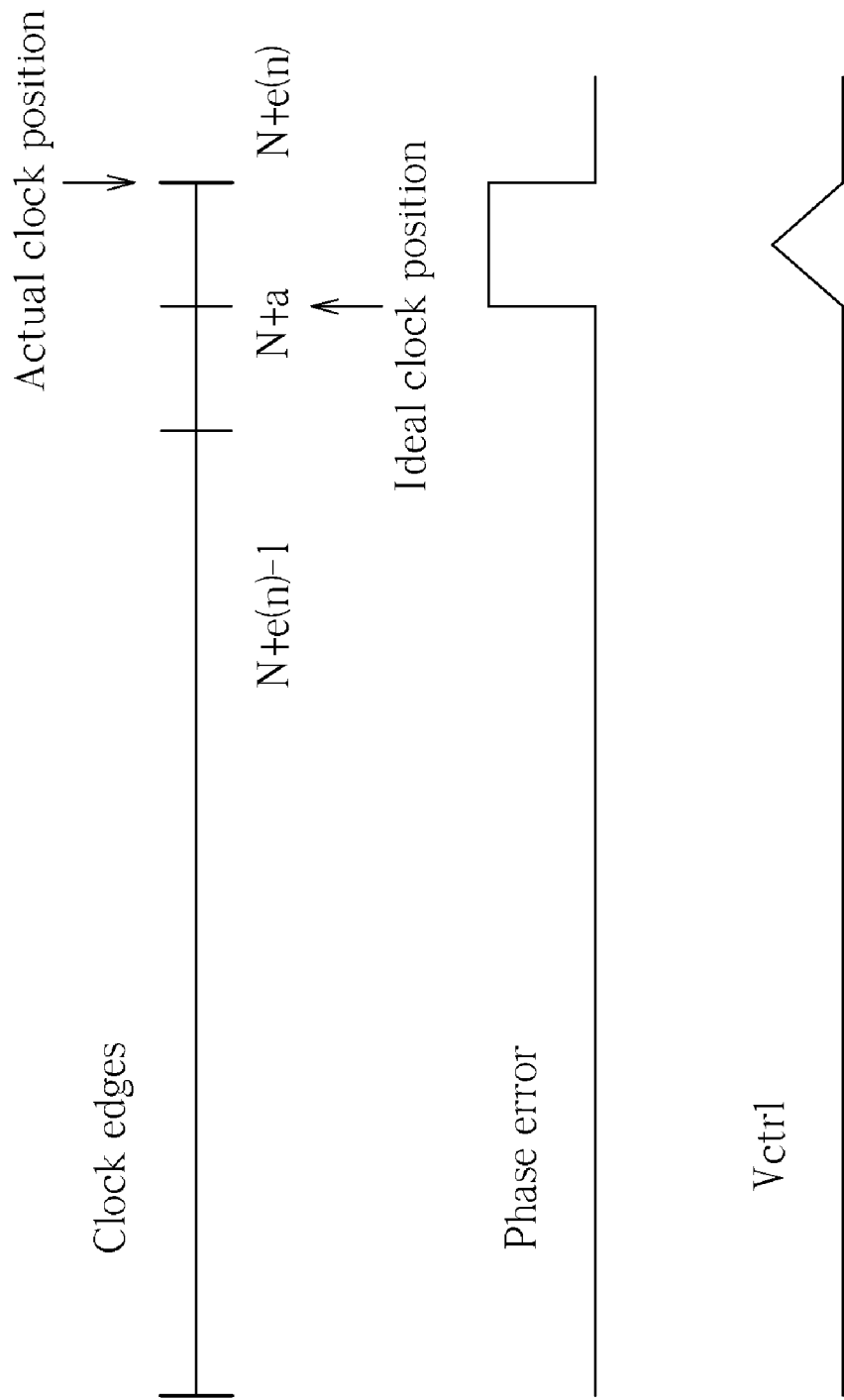
FIG. 9 is a simplified diagram in explaining how conventional fractional phase errors of a conventional analog PLL are compensated.

In FIG. 1, the error compensation signal Error is generated from the SDM compensation module 114 for compensating possible errors from the TDC module 102 and the TDC decoder 1022. The error compensation signal is primarily based on fractional phase errors. Please refer to FIG. 9, which is a simplified diagram in explaining how conventional fractional phase errors of a conventional analog PLL are compensated. In FIG. 9, folded edges indicate clock edges, and a fractional phase error may be indicated as a difference between an actual clock position N+e(n), which is generated from a SDM, and an ideal clock position N+aa, where e(n) is an integer, and aa is a fractional number. Therefore, a corresponding fractional phase error phase_error generated from a phase frequency detector (PFD) may be represented as:

$$\text{phase\_error} = [N+e(n)-(N+aa)] \cdot T_{VCO} = [e(n)-aa] \cdot T_{VCO} \qquad (15)$$

The term $T_{VCO}$ indicates a period of a VCO since the equation (15) is inducted according to an analog PLL and roughly equals $$\frac{1}{Fref \cdot (N+a)}.$$

An accumulated compensation error compensation_error may thus be derived by accumulating the corresponding fractional phase error phase_error and be derived as:

$$\text{compensation\_error} = \Sigma[e(n)-aa] \cdot T_{VCO} \qquad (16)$$

By using a TDC, the compensation error may be quantized as follows:

$$\text{compensation\_error} = \Sigma[e(n)-aa] \cdot T_{VCO}/TDC \approx \Sigma[e(n)-aa]/[TDC \cdot Fref \cdot (N+a)] \qquad (17)$$

Figure 10:
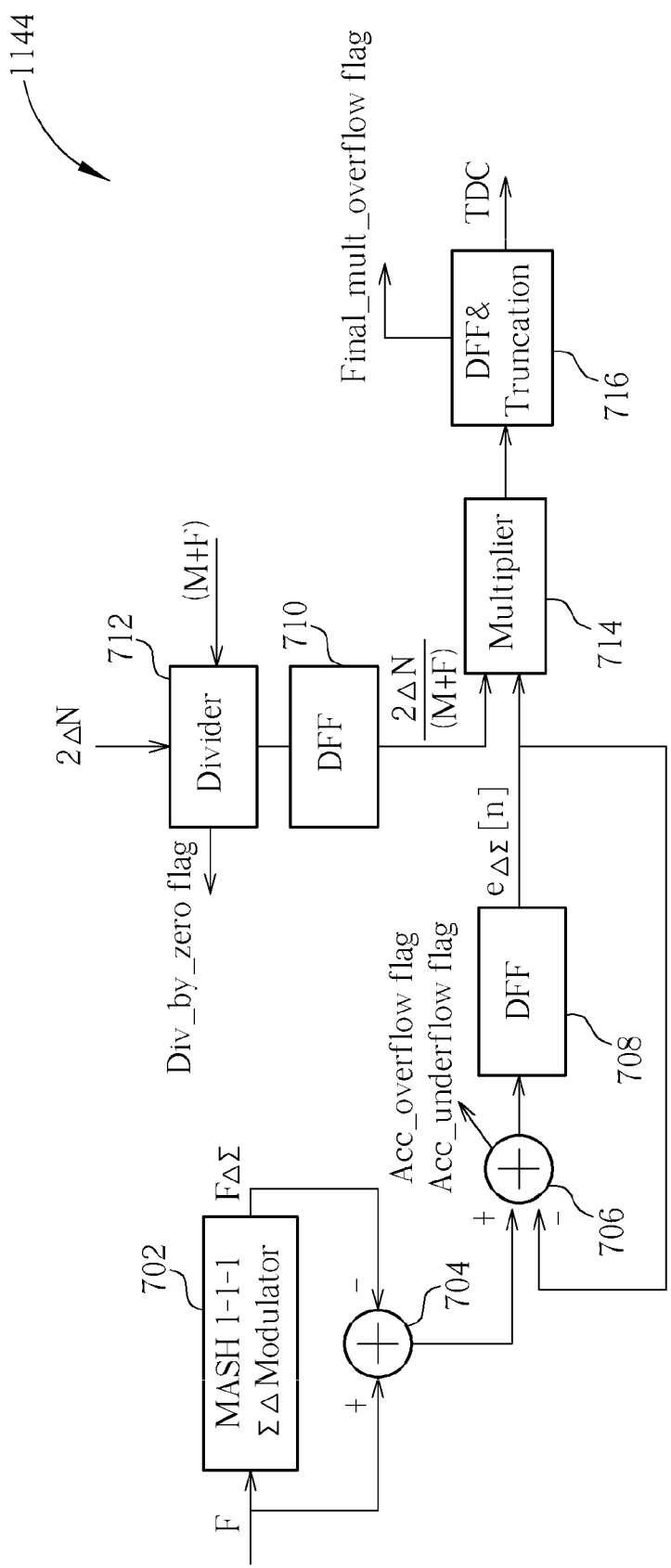
FIG. 10 is a diagram of a digital phase error cancellation module further included in the SDM compensation module shown in FIG. 1 according to a preferred embodiment of the present invention.

However, using a TDC may cause a code variance, for example, $N_1$, as well as a large number of delay lines in the TDC, and take large circuit area and power also. Therefore, a cyclic TDC is proposed in the present invention and disposed within the PFD/CTDC module 1021 for significantly saving many taps of delay lines. The disclosure of the CTDC will be described later. Moreover, in the ADPLL 100 of the present invention, a DCO 1104 is used for replacing the conventional VCO. The difference between the actual clock position N+e (n) and the ideal clock position N+aa may be derived with the aid of the SDM 1121 so that the difference may be denoted as $e_{\Delta\Sigma}$, which is in fact a quantization error. According to an error compensation algorithm used in the present invention, the compensation error $e_{CTDC}[k]$ of the cyclic TDC within the PDF/CTDC module 1021 may be indicated as:

$$e_{CTDC}[k] = \sum_{n=0}^{k-1} e_{\Delta\Sigma} \cdot \frac{T_{DCO}}{TDC} \quad (18)$$

$$= \sum_{n=0}^{k-1} e_{\Delta\Sigma} \cdot \frac{1}{TDC \cdot Fref \cdot (I+F)}$$

$$= \sum_{n=0}^{k-1} e_{\Delta\Sigma} \cdot \frac{\Delta N}{\Delta t \cdot Fref \cdot (I+F)}$$

$$= \sum_{n=0}^{k-1} e_{\Delta\Sigma} \cdot \frac{2 Fref \cdot \Delta N}{Fref \cdot (I+F)}$$

$$= \sum_{n=0}^{k-1} e_{\Delta\Sigma} \cdot \frac{2 \cdot \Delta N}{(I+F)}$$

where the term I occupies the same definition as N. $T_{DCO}$ is a period of the DCO 1104. As can be observed from the equation (18), the compensation error $e_{CTDC}[k]$ of the cyclic TDC may be completely controllable and digital so as to be used in the digital phase error cancellation. Please refer to FIG. 10, which is a diagram of a digital phase error cancellation module 1144 further included in the SDM compensation module 114 according to a preferred embodiment of the present invention. The digital phase error cancellation module 1144 is based on the equation (18). The digital phase error cancellation module 1144 includes a SDM 702, a first adder 704, a second adder 706, a first D flip-flop (DFF) 708, a second D flip-flop 710, a divider 712, a multiplier 714, and a DFF/Truncation module 716. The SDM 702 is implemented with a multi stage noise shaping (MASH) 1-1-1 modulator having first order modulators. An obvious benefit in using a MASH n-1-1 modulator having an n-th order modulator and all other first order modulators lies in the fact that coefficient mismatches are less since most noises are easily cancelled inside. The SDM 702, the first adder 704, the second adder 706, and the first DFF 708 are utilized for generating the quantization error $e_{\Delta\Sigma}$. The second DFF 710 and the second divider 712 are utilized for generating the term $$\frac{2 \cdot \Delta N}{(I+F)}.$$

The compensation error $e_{CTDC}[k]$ is outputted to the first adder 104 at last.

A specific technique of the present invention is also used in the TDC decoder 1022. In this technique, an error protection code is further added into the output signal TDC of the TDC decoder 1022 for raising precision of the output signal TDC. Assume inputs of the TDC decoder 1022 include a digital code $D[0:2^m-1]$ having $2^m$ bits, and a cycle code $C[0:(m-1)]$ having m bits, where m is a positive integer. In a preferred embodiment of the present invention, the value of the positive integer m is 5 so that the cycle code C has 5 bits, and so that the digital code D has 32 bits. In a simplest way, an error protection code err_protect is generated by performing an exclusive-or operation on a last bit of the digital code D and a first bit of the cycle code C. Therefore, the error protection code err_protect may be represented as:

$$err\_protect = XOR(D[2^m-1], C[0]) \quad (19)$$

In a preferred embodiment of the present invention, an output signal TDC[0:2(m−1)+1] of the TDC decoder 1022 having 10 bits may also be indicated as:

$$TDC[0:2\cdot(m-1)+1] = (C[0:(m-1)] + err\_protect)*2^m + output1[0:(m-1)]  \quad (20)$$

Note that the term output1 indicates a decoding signal of the TDC decoder 1022 for indicating how many bits 0 or bits 1 in the digital code D. By adding the error protection code (or bit) into the cycle code C, and by raising the cycle code C by m bits (since the multiplier is $2^m$), the precision of the output signal TDC of the TDC decoder 1022 is significantly raised.

Figure 11:
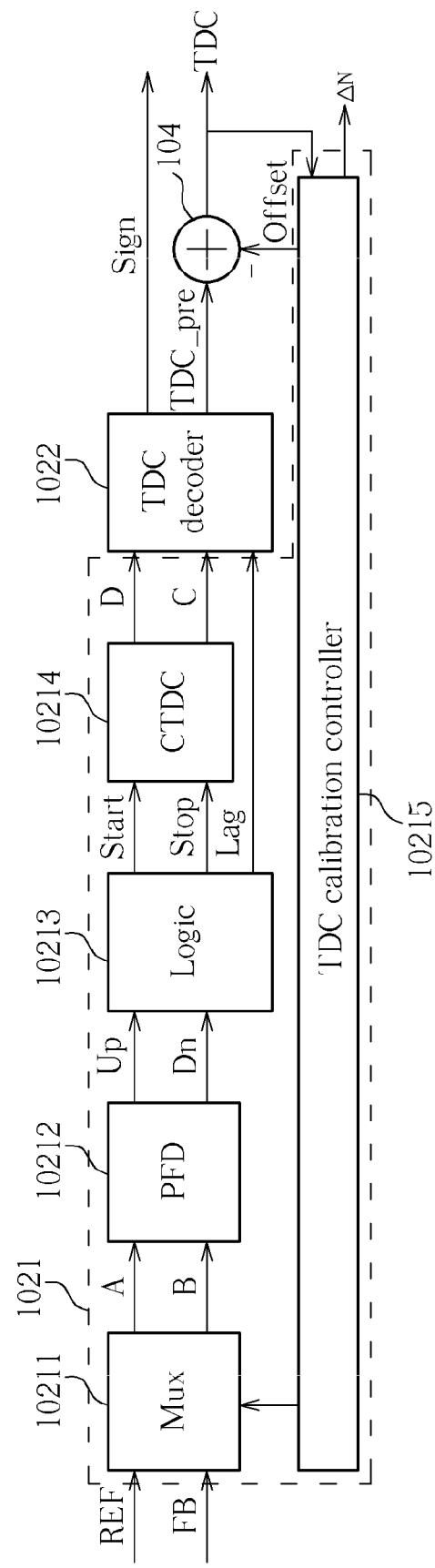
FIG. 11 illustrates a simplified diagram of the PFD/CTDC module shown in FIG. 1 along with the TDC decoder and the first adder shown in FIG. 1 while the loop gain calibration described in FIG. 8 is performed.
Figure 12:
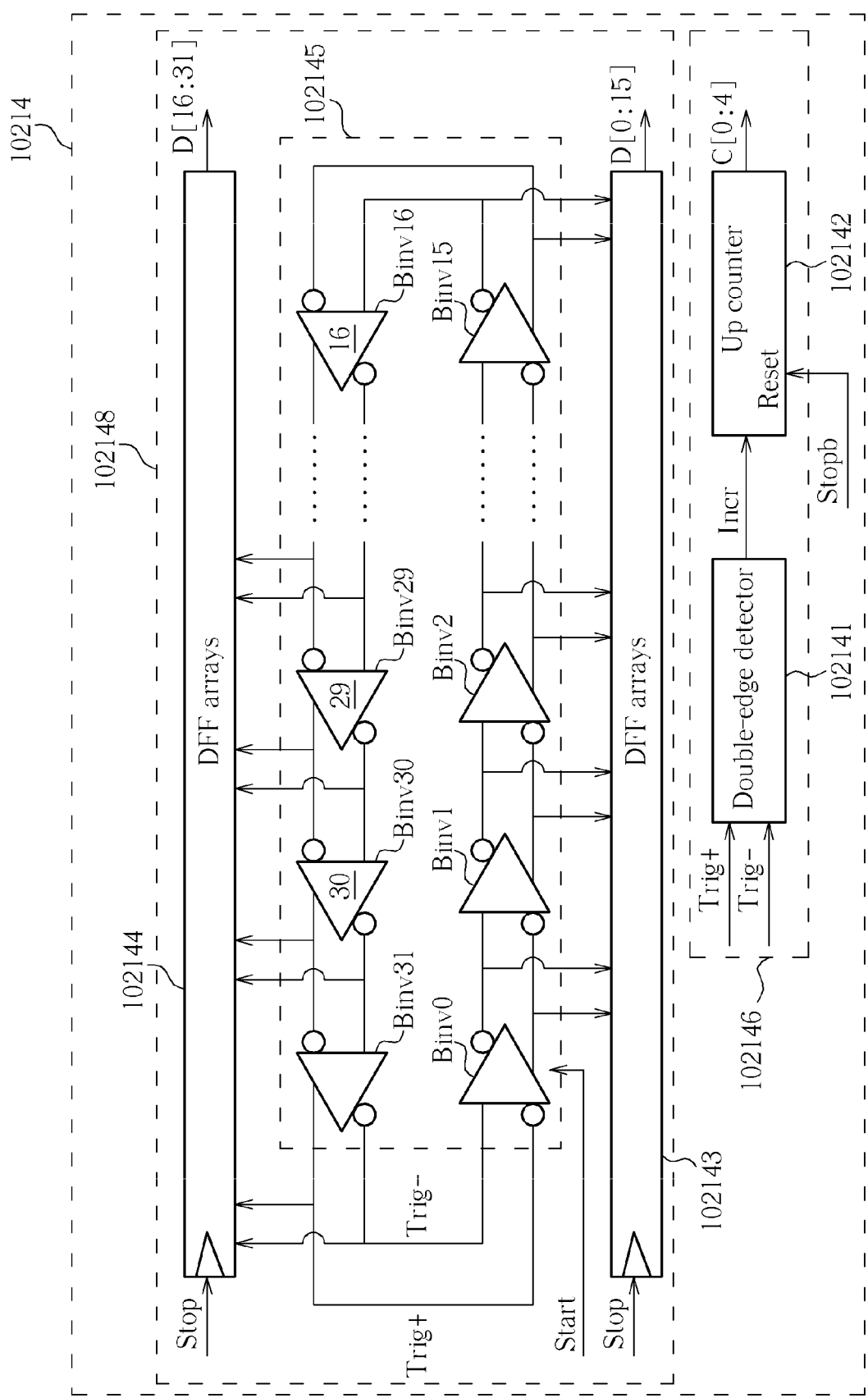
FIG. 12 illustrates a schematic diagram of a cyclic time-to-digital converter (CTDC) used in FIG. 11.
Figure 13:
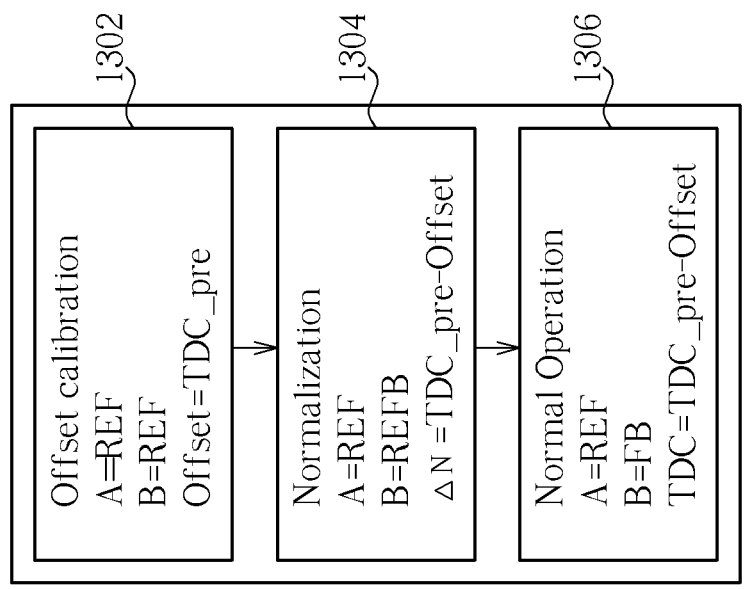
FIG. 13 illustrates a CTDC calibration procedure related to both FIG. 11 and FIG. 12.

Please refer to FIG. 11, FIG. 12, and FIG. 13. FIG. 11 illustrates a simplified diagram of the PFD/CTDC module 1021 shown in FIG. 1 along with the TDC decoder 1022 and the first adder 104 shown in FIG. 1 while the loop gain calibration described in FIG. 8 is performed. FIG. 12 illustrates a schematic diagram of a cyclic time-to-digital converter (CTDC) used in FIG. 11. FIG. 13 illustrates a CTDC calibration procedure related to both FIG. 11 and FIG. 12.

As shown in FIG. 11, the PFD/CTDC module 1021 includes a multiplexer 10211, a phase-frequency detector (PFD) 10212, a logic unit 10213, a CTDC 10214, and a TDC calibration controller 10215. The multiplexer 10211 is utilized for receiving the reference signal REF and the feedback signal FB shown in FIG. 1. The PFD 10212 receives two output signals A and B from the multiplexer 10211, where both the output signals A and B correspond to the reference signal REF or the feedback signal FB. The PFD 10212 also outputs a frequency-raising signal Up and a frequency-lowering signal Dn for raising or lowering a frequency of the output signal TDC of the TDC decoder 1022, as described in FIG. 1. The logic unit 10213 receives both the frequency-raising signal Up and the frequency-lowering signal Dn, and issues an activating signal Start or a deactivating signal Stop for activating or deactivating the CTDC 10214 at any time. The logic unit 10213 also outputs the sign signal Lag to the TDC decoder 1022. The CTDC 10214 generates the data signal D corresponding to D flip-flops within and the cycle signal C corresponding to a utilized cycle within. The TDC calibration controller 10215 generates a calculated offset signal Offset according to the output signal TDC, and generates the code variance ΔN.

As shown in FIG. 12, the CTDC 10214 includes a cycle module 102146 and a data module 102148. The cycle module 102146 includes a double-edge detector 102141 and an N-bit up counter 102142, and generates the cycle signal C of the PFD/TDC module 102. The data module 102148 includes a first D flip-flop array set 102143, a second D flip-flop array set 102144, and a cyclic buffer array 102145, and generates the data signal D of the PFD/TDC module 102. The double-edge detector 102141 receives triggering signals Trig+ and Trig− within the data module 102148 for detecting a rising edge or a falling edge. Whenever the double-edge detector 102141 receives the triggering signal Trig+ or the triggering signal Trig− from the data module 102148, a count of the N-bit up-counter 102142 is incremented. Each time when the count of the N-bit up-counter 102142 exceeds a predetermined number, a new cycle is initiated in the N-bit up-counter 102142 begins whereas an old cycle ends. At this time, a number for recording a current cycle of the N-bit up-counter 102142 is outputted in the form of the cycle signal C. In a preferred embodiment of the present invention, a number of bits within the cycle signal C is 5. The first D flip-flop array 102143, the second D flip-flop array 102144, and the cyclic buffer array 102145 together forms a cyclic structure. Note that the cyclic buffer array 102145 includes a plurality of delay line buffers Binv connected in series, and an input terminal of a first delay line buffer within the plurality of delay line buffers Binv is coupled to an output terminal of a last delay line buffer within the plurality of delay line buffers Binv. In a preferred embodiment of the present invention, a number of the plurality of delay line buffers Binv is 32, i.e. the delay line buffers Binv0, Binv1, Binv2, ... , Binv30, and Binv31 illustrated in FIG. 12; and the plurality of delay line buffers Binv is implemented with inverters or other logic units appropriate for implementing delay line taps. The first D flip-flop array 102143 cooperates with a front half of the plurality of delay line buffers Binv, and the second D flip-flop array 102144 cooperates with a rear half of the plurality of delay line buffers Binv. When the number of the plurality of delay line buffers Binv is 32, the first D flip-flop array 102143 outputs a first half of the data signal D with 16 bits, whereas the second D flip-flop array 102144 outputs a second half of the data signal with 16 bits.

As shown in FIG. 13, a calibration procedure of the CTDC 10214 for calibrating the loop gain of the ADPLL 100 or 200 is described.

In Step 1302, an offset calibration is performed by assigning input signals A and B with the reference signal REF respectively by directly manipulating the multiplexer 10211. Moreover, an offset signal Offset from the TDC calibration controller 10215 is also assigned as a predict signal TDC_pre from the TDC decoder 1022. Note that the predict signal TDC_pre includes information of the feedback signal FB so that a predicted error in the signal TDC may be compensated in advance with the aid of the first adder 104. At this time, the signal TDC should be logic 0, and the offset calibration is completed.

In Step 1304, a normalization procedure is performed by keeping the input signal A as the reference signal REF and re-assigning the input signal B as an inverse REFB of the reference signal REF, i.e. padding a bar for indicating the inverse of the reference signal REFB. At this time, the above-mentioned fractional code variance AN is generated from the TDC calibration controller 10215 in a form of a TDC predict offset signal TDC_pre-Offset for performing the normalization of the ADPLL 100 or 200 during the loop gain calibration.

In Step 1306, a normal operation is performed while the ADPLL 100 or 200 is also under normal operations. At this time, the input signal A is still kept as the reference signal REF, and the input signal B is re-assigned as the feedback signal FB for measuring properties of a newly outputted signal from the DCO/SDM module 110 in a next delay.

With the aid of the ADPLL and other related components or methods disclosed in the present invention, defects in a conventional analog phase-locked loop may be removed since all components and operations in the disclosed ADPLL are digital. Moreover, with the aid of the precise loop gain calibration method used in the disclosed ADPLL of the present invention, an available bandwidth of the ADPLL is significantly broadened since an all-pass frequency response is retrieved.

By defining a proportional path gain of an ADPLL by a bandwidth and a reference frequency of the ADPLL, and by a TDC gain, a DCO gain, a dividing ratio of a frequency divider, a gain of an amplifier or a combination thereof, the gain of the amplifier may be adjusted so that an optimal loop bandwidth of the ADPLL may be well calibrated. For achieving the aim of entirely digital of the ADPLL, the gains of the TDC and the DCO may be further adjusted in a digital manner.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A loop gain calibration method for an all-digital phase-locked loop (ADPLL), comprising:

modulating a gain of a sigma delta modulator compensation module (SDMCM) amplifier of a SDM compensation module according to a code variance corresponding to a half of a reference period of a reference signal received by a TDC module of the ADPLL, a reference frequency of the reference signal received by the TDC module, a frequency response of a DCO of a DCO/SDM module of the ADPLL or a combination thereof; and modulating a gain of a modulator (MOD) amplifier of a modulator according to a frequency variance in an input terminal of a Sigma Delta Modulator (SDM) of a feedback path module of the ADPLL, a code variance corresponding to the frequency variance, a fractional code variance, the reference frequency of the reference signal received by the TDC module or a combination thereof.

2. The loop gain calibration method of claim 1 wherein modulating the gain of the SDMCM amplifier according to the code variance corresponding to a half of the reference period of the reference signal received by the TDC module of the ADPLL, the reference frequency of the reference signal received by the TDC module, the frequency response of the DCO of the DCO/SDM module of the ADPLL or the combination thereof comprises:

modulating the gain of the SDMCM amplifier as:

$$b = \frac{2N_1}{M} \cdot \frac{1}{Fref} \cdot \frac{Z^{-1}}{1 - Z^{-1}}$$

wherein b is the gain of the SDMCM amplifier; $N_1$ is the code variance corresponding to a half of the reference period Tref of the reference signal received by the TDC module;

$$\frac{1}{M}$$

is the response of a frequency divider; Fref is the reference frequency of the reference signal received by the TDC module;

$$\frac{Z^{-1}}{1-Z^{-1}}$$

indicates the frequency response of the DCO.

3. The loop gain calibration method of claim 2, further comprising:
    modulating the gain of an accumulator (ACC) amplifier for an accumulator as:

$$b = \frac{2N_1}{M} \cdot \frac{1}{Fref} \cdot \frac{Z^{-1}}{1-Z^{-1}}$$

wherein b is the gain of the ACC amplifier; $N_1$ is the code variance corresponding to a half of the reference period Tref of the reference signal received by the TDC module;

$$\frac{1}{M}$$

is the response of a frequency divider; Fref is the reference frequency of the reference signal received by the TDC module;

$$\frac{Z^{-1}}{1-Z^{-1}}$$

indicates the frequency response of the DCO.

4. The loop gain calibration method of claim 1 wherein modulating the gain of the MOD amplifier according to the frequency variance in the input terminal of the SDM of the feedback path module of the ADPLL, the code variance corresponding to the frequency variance, the fractional code variance, the reference frequency of the reference signal received by the TDC module or the combination thereof comprises:
    modulating the gain of the MOD amplifier as:

$$c = \frac{\Delta I}{\Delta N \cdot Fref}$$

wherein c is the gain of the MOD amplifier; $\Delta N \cdot Fref$ indicates the frequency variance in the input terminal of the SDM; $\Delta I$ indicates the code variance corresponding to the frequency variance ·delta·N* Fref, and is retrieved at an output signal of a digital low-pass filter; $\Delta N$ indicates the fractional code variance; Fref is the reference frequency of the reference signal received by the TDC module.

5. The loop gain calibration method of claim 3 wherein modulating the gain of the MOD amplifier according to the frequency variance in the input terminal of the SDM of the feedback path module of the ADPLL, the code variance corresponding to the frequency variance, the fractional code variance, the reference frequency of the reference signal received by the TDC module or the combination thereof comprises:
    modulating the gain of the MOD amplifier as:

$$c = \frac{\Delta I}{\Delta N \cdot Fref}$$

wherein c is the gain of the third amplifier; $\Delta N \cdot Fref$ indicates a frequency variance in the input terminal of a SDM of the feedback path module; $\Delta I$ indicates a code variance corresponding to the frequency variance $\Delta N \cdot Fref$ and is retrieved at an output signal of a digital low-pass filter of a digital macro module; ·delta·N indicates the fractional code variance; Fref is the reference frequency of the reference signal received by the TDC module.

6. The loop gain calibration method of claim 5 further comprising: providing the ADPLL comprising:
    the time-to-digital converter (TDC) module for receiving the reference signal;
    the digital macro module having the digital low-pass filter;
    an error compensation module comprising:
    a first accumulator; and
    a first amplifier;
    the digital-controlled oscillator (DCO)/sigma-delta modulator (SDM) module having the digital-controlled oscillator (DCO); the feedback module for cooperating with the error compensation module;
    the accumulator having an input terminal for receiving a modulation signal;
    the ACC amplifier having an input terminal coupled to an output terminal of the accumulator, an output terminal coupled to a first adder of the digital macro module, and a same gain with a gain of the first amplifier; and
    the MOD amplifier having an input terminal for receiving a modulation signal, and an output terminal coupled to a second adder of the digital macro module.

* * * * *